United States Patent [19]

Dietze et al.

[11] 4,203,940

[45] May 20, 1980

[54] CRYSTAL WAFER RACK STRUCTURES AND THE METHOD OF PRODUCING THE SAME

[75] Inventors: Wolfgang Dietze; Gerhard Bachmann, both of Munich, Fed. Rep. of Germany

[73] Assignee: Siemens Aktiengesellschaft, Berlin & Munich, Fed. Rep. of Germany

[21] Appl. No.: 510,071

[22] Filed: Sep. 27, 1974

[30] Foreign Application Priority Data

Oct. 2, 1973 [DE] Fed. Rep. of Germany ....... 2349512

[51] Int. Cl.² .............................................. B28B 1/48
[52] U.S. Cl. ..................................... 264/154; 264/162
[58] Field of Search ................. 264/65, 163, 162, 154, 264/284, 81; 211/41

[56] References Cited

U.S. PATENT DOCUMENTS

| | | | |
|---|---|---|---|
| 3,226,254 | 12/1965 | Reuschel | 211/41 |
| 3,480,151 | 11/1969 | Schmitt | 211/41 |
| 3,534,862 | 10/1970 | Shambelan | 211/41 |
| 3,850,296 | 11/1974 | Hirata et al. | 211/41 |

FOREIGN PATENT DOCUMENTS 180726 12/1952 Austria ................................... 264/154

OTHER PUBLICATIONS

Kobayashi, "Characteristics of the Diamond Cutting-Off Wheel for Germanium and Ceramics," Proc. First, Int'l, Cong. Diamonds, pp. 229–239 (1962).

*Primary Examiner*—John A. Parrish
*Attorney, Agent, or Firm*—Hill, Van Santen, Steadman, Chiara & Simpson

[57] ABSTRACT

Crystal wafer rack structures composed of Si or SiC are produced by forming a tube-shaped body, for example, of Si, by pyrolytic deposition of silicon on a heated graphite mandrel from a suitable gaseous atmosphere with the removal of the mandrel without destroying the body and then machining the tube so that two separate wall portions are formed therefrom which extend parallel to the tube axis and are joined to one another by at least one bridging portion in the form of a closed arc between such wall portions and a plurality of uniformly spaced support grooves are provided in each of the wall portions for supporting the wafers during processing.

3 Claims, 6 Drawing Figures

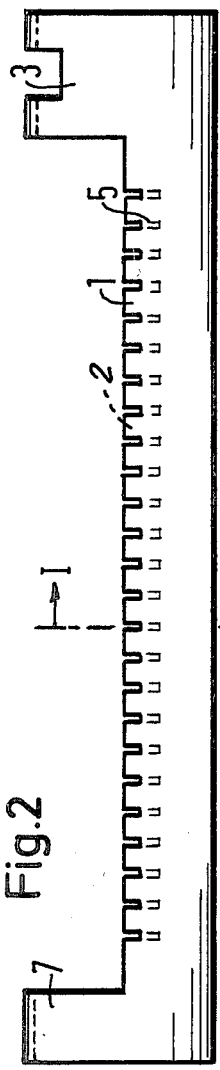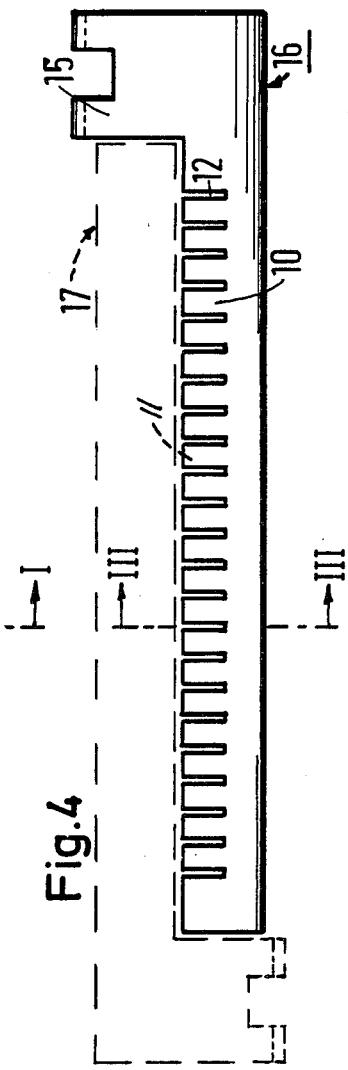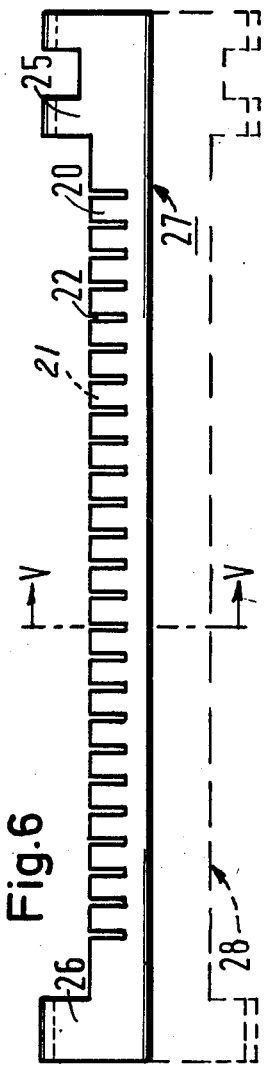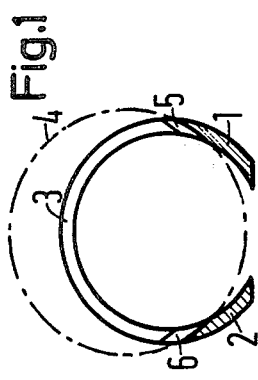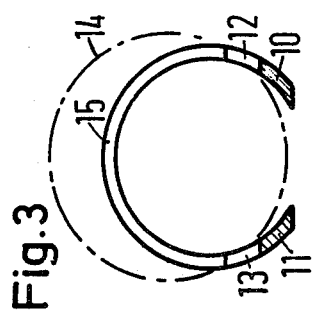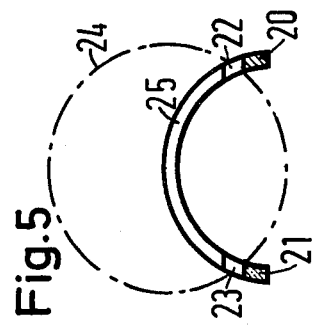

CRYSTAL WAFER RACK STRUCTURES AND THE METHOD OF PRODUCING THE SAME

BACKGROUND OF THE INVENTION

1. Field of the Invention

The invention relates to rack structures and a method of producing the same and somewhat more particularly to Si or SiC crystal wafer rack structures which support crystal wafers during diffusion doping and/or annealing procedures and a method of producing the same.

2. Prior Art

Si or SiC rack structures of the type required for diffusion doping and/or annealing procedures on crystal wafers, such as silicon wafers which are useful in semiconductor technology, are superior in terms of temperature stability and purity of environment in relation to comparable and more conventional quartz rack structures. However, Si or SiC rack structures are extremely difficult and expensive to produce from solid Si or SiC bodies.

Methods of manufacturing tubes or hollow bodies composed of semiconductor materials by a gas phase pyrolytic deposition of semiconductor materials is known. For example, German Offenlegungsschrift 21 25 085. 1 (which corresponds to U.S. Pat. No. 3,747,559) discloses that a silicon tube closed at one end may be manufactured by gas phase deposition from a hydrogen silico-chloroform mixture at about 1200° C. on a graphite tube or mandrel, following which the graphite mandrel or carrier member is removed without destroying the so-deposited silicon layer. Tubes of this type are in use for diffusion doping and/or annealing procedures in semiconductor technology.

SUMMARY OF THE INVENTION

The invention provides an extremely economical and simple crystal wafer rack structure and manner of manufacturing the same from hollow tubes composed of silicon material selected from the group consisting of Si and SiC so that the produced rack structure readily supports a plurality of crystal wafers for diffusion and/or annealing procedures in a single operation.

In accordance with the principles of the invention, a Si or SiC tube is manufactured in a manner known per se by the deposition of, for example, Si, from a gas phase Si material on a heated graphite mandrel, with the removal of the mandrel without destroying the so-deposited Si layer and the resulting tube is then machined in directions parallel and perpendicular to the longitudinal tube axis so that the two wall portions are produced which extend in parallel relation to the tube axis and are joined to one another via at least one bridging portion which comprises an extension of the wall portions and forms a closed arc. Each of the wall portions are provided with aligned and uniformly spaced support grooves for transversely holding crystal wafers which are to be treated, such as by diffusion or annealing procedures.

BRIEF DESCRIPTION OF THE DRAWINGS

FIGS. 1, 3 and 5 are cross-sectional views of certain preferred embodiments of rack structures produced in accordance with the principles of the invention, each having a crystal wafer shown in phantom therein; and FIGS. 2, 4 and 6 are side elevational views of the embodiments illustrated at FIGS. 1, 3 and 5, respectively, and in FIGS. 4 and 6 include a phantom illustration of a further rack structure manufactured from a single tube in accordance with the principles of the invention.

DESCRIPTION OF THE PREFERRED EMBODIMENTS

The invention provides an extremely economical and simple crystal wafer rack structure and a method of manufacturing the same so that such structures are capable of supporting in a single operation a plurality of crystal wafers in spaced-apart relation during a diffusion and/or annealing procedure.

In accordance with the principles of the invention, Si or SiC tubes are manufactured in a manner known per se by the deposition of a silicon material selected from the group consisting of Si and SiC from a suitable gas phase silicon material onto a heated carrier member or mandrel composed of graphite. The so-produced tubes are removed from the carrier member without destroying the tubes, as by destructive or non-destructive removal of the mandrel through mechanical or chemical means. The so-produced tubes are then machined into select forms of rack structures by cutting and/or grinding operations in directions parallel and perpendicular to the longitudinal tube axis so as to produce two separate wall portions having free edges which extend parallel to the tube axis and are joined together by at least one bridging portion which is an extension of the wall portions and forms a closed arc. Each of the wall portions are provided with a plurality of uniformly spaced and aligned supporting grooves for transversely holding crystal wafers mounted therein.

In accordance with the principles of the invention, the machining operations on the Si or SiC tubes are preferably accomplished with diamond saws and/or diamond grinding discs.

In order to produce as uniform a deposition as possible on all points of a graphite carrier or mandrel, it is recommended that the gas phase deposition be conducted with a gas mixture consisting of hydrogen and silico-chloroform or trichloromethyl silane, which decomposes at about 1200° C. and to deposit Si or SiC at the highest possible rate. In this manner, a smooth, pimple-free deposition is attained and the wall thickness of the formed tube is uniform throughout, which greatly influences the ensuing machining operations. In preferred embodiments, the wall thickness of the formed Si or SiC tubes should be at least 1 mm.

It is a feature of the invention to utilize saw discs and grinding discs during the machining operations which have a diameter and thickness corresponding to the to-be treated crystal wafers. In this manner, proper location and support of the crystal wafers within the rack structure, for example, during a diffusion doping operation, is ensured.

By following the teachings of the instant invention, one may simply and economically manufacture rack structures from Si or SiC tubes, which are characterized by two outwardly curving parallel side portions which are joined together by at least one bridging portion which is an extension of the side portions and forms a closed arc. The rack structure produced in accordance with the principles of the invention are further characterized by a plurality of uniformly spaced support grooves in each of the side portions and which extend transversely of the tube axis for accommodating, for example, silicon crystal wafers during treatment thereof, as in diffusion doping or annealing.

In a preferred embodiment of the invention, the depth of the support grooves or slots in the side portions and the height of such side portions are so dimensioned via the machining operation that the crystal wafers are each held separately at the top edge of each side wall so as to provide a two-point support.

The Si or SiC rack structures produced in accordance with the invention, because of their favorable external shape, are extremely well suited for carrying out diffusion operations on, say Si crystal wafers in, for example, Si enclosures or tubes, also produced by gas phase deposition, since such enclosures are readily manufactured on graphite mandrels of a correspondingly larger cross-section than used in the manufacture of the tubes machined into the rack structures. Since the rack structures and the diffusion tubes are of corresponding shape, proper location of the racks within the diffusion tubes is insured. The rack structure itself occupies a very small amount of space so that any diffusion gas fed into the diffusion tube can flow virtually unimpeded around all edge portions of the transversely disposed crystal wafers supported by the rack. In this manner, uniform diffusion is insured. The crystal wafers are stably supported by the favorable two-point support system provided and are only partially masked at two points along their outer periphery.

Production of Si or SiC tubes, which may be machined into rack structures in accordance with the principles of the invention, is preferably accomplished in accordance with the teachings of German Offenlegungsschrift 21 25 085. 1 (which is incorporated herein by reference). However, other suitable methods of manufacturing Si or SiC tubes may also be employed.

From such Si or SiC tubes, rack structures such as illustrated in the drawings are produced in accordance with the principles of the invention.

The embodiment illustrated at FIG. 1 in section and at FIG. 2 in side elevation is formed from such tubes by making cuts parallel and perpendicular to a longitudinal tube axis, preferably with a diamond saw and/or diamond grinding disc.

As shown in the drawings, cuts are made parallel to the longitudinal tube axis along substantially opposing sides thereof so that one side, i.e., the bottom side of the so-machined structure, is provided with two spaced-apart and independent wall edges capable of standing on a flat support means and thus define the base of such a structure, while the other side of the tube is so-cut as to form two spaced-apart wall portions which are joined to one another by a bridging portion at an upper peripheral end of such wall portions. After machining, wall portions 1 and 2 are left, and as best seen in FIG. 2, wall portions 1 and 2 extend in spaced apart relation to one another for a major portion of the tube length. The wall portions 1 and 2 are joined to one another at the peripheral ends thereof via at least one bridging portion 3. A silicon crystal wafer 4, shown in phantom, may be mounted in aligned support grooves 5 and 6 in each of the wall portions 1 and 2 respectively and, as shown, the diameter of the initially formed tube is smaller than the diameter of the crystal wafer to be supported in the resulting rack structure.

As best seen at FIG. 2, this embodiment of a rack structure is provided with a pair of bridging portions 3 and 7 at opposite ends of the rack structure. The bridging portions are defined by an upward extension of the wall portions 1 and 2, i.e., the original tube is left undisturbed at the peripheral ends thereof except for machining a base portion therefrom. By using saw discs which have the same diameter and the same thickness as the crystal wafers which are to be supported by such a rack in forming the grooves or slots 5 and 6, a rack structure is obtained which is extremely well mated with the crystal wafers (as is well known, a saw of a given thickness necessarily produces a cut of sufficient tolerance to allow such saw to be withdrawn from such cut and/or reinserted therein. Accordingly, a wafer of a thickness equal to that of a saw disc used to produce cuts or grooves 5 and 6 is readily accommodated within such grooves.)

Another embodiment of a rack structure produced in accordance with the principles of the invention, which is somewhat similar to that of FIGS. 1 and 2, is shown at FIGS. 3 and 4. The difference between this embodiment is best seen in comparing FIGS. 2 and 4. In the present embodiment, an appropriately shaped tube is longitudinally split or cut into two rack structures 16 and 17 (which is shown in phantom) respectively, so that the racks are mirror images of one another. This manner of producing rack structures further lowers the cost thereof. As shown, these type of rack structures have only a single bridging portion 15 joining one end of wall portions 10 and 11 respectively. Each of the wall portions 10 and 11 are provided with support slots or grooves 12 and 13 respectively, for transversely supporting a crystal disc 14 (shown in phantom) thereby. FIG. 4 illustrates one rack structure 16 in full line and shows the other rack structure 17 in broken line, both in relation to an originally provided Si or SiC tube.

FIGS. 5 and 6 illustrate a further embodiment of a rack structure produced in accordance with the principles of the invention. In this embodiment, two substantially identical rack structures 27 and 28 (shown in phantom) can be simply and economically manufactured from a single tube. In forming such rack structures, a tube is cut longitudinally along its center axis and both the resultant upper and lower halves are machined into rack structures. The bridging portions 25 and 26 may mask mounted crystal wafers in such rack structures to a somewhat lesser extent at corresponding points than the rack structures of the earlier embodiments. In this embodiment the wall portions are indicated by reference numerals 20 and 21, respectively, and the grooves within such wall portions are indicated by reference numerals 22 and 23, respectively. A crystal wafer 24 (shown in phantom) is illustrated at FIG. 5 mounted within, for example, rack structure 27. The relation of the two rack structures 27 and 28 in an unmachined tube is illustrated at FIG. 6.

Accordingly, the invention comprises the manufacture of a silicon material (Si and/or SiC) rack structure for supporting crystal wafers during diffusion and/or annealing operations. In the manufacture of such a rack structure, first a tube composed of a silicon material is formed in a known manner by depositing silicon material from a gas phase thereof onto a heated graphite mandrel or carrier member and non-destructively removing the so-formed tube from the mandrel. Next, the tube is machined on a relatively narrow transverse (to the longitudinal axis of the tube) portion of a side surface of the tube which is adjacent to at least one end of the tube in a direction perpendicular to the longitudinal axis of the tube for a first distance which is less than the diameter of the tube so as to produce a tube having a perpendicular cut or groove at least at one end thereof. Thereafter, the so-cut tube is machined on a relatively wide axial portion of the tube side surface at a location adjacent the cut in a direction parallel to the longitudinal tube axis for a vertical distance substantially equal to the first distance (i.e. the depth of the perpendicular cut) so as to produce two spaced apart wall portions having free edges extending parallel to the longitudinal tube axis and being joined to one another by at least one bridging portion located at least at one end of the tube so as to define an initial rack structure. The initial rack structure is then machined along the spaced apart wall portions at spaced intervals along the free edges thereof in a direction perpendicular to the longitudinal tube axis for a second distance which is less than the height of the wall portions so as to produce a plurality of substantially uniformly spaced support grooves in each of the wall portions for transversely supporting select crystal wafers therein. The invention may also include machining the initial rack structure surface portion opposite to the wall portions thereof across the entire length of such surface portion in a direction parallel to the longitudinal tube axis for a third distance, which is less than the second distance so as to produce a base surface for the rack structure capable of standing on a flat support means.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as is set forth and defined in the hereto-appendant claims.

We claim as our invention:

1. A method of manufacturing rack structures composed of a silicon material selected from the group consisting of Si and SiC for supporting crystal wafers during diffusion and annealing operations, comprising:

forming, in a manner known per se, a tube having a diameter which is smaller than the diameter of the crystal wafer to be supported by the rack structures by depositing said silicon material from a gas phase thereof onto a heated graphite carrier member and removing the carrier member without destroying the so-formed tube;

machining the so-formed tube on a relatively narrow transverse portion of a side surface of said tube adjacent to at least one end thereof in a direction perpendicular to a longitudinal axis of said tube for a first distance which is less than the diameter of said tube so as to produce a tube having a cut at least at one end thereof;

machining the so-cut tube on a relatively wide axial portion of said side surface of said tube at a location adjacent said cut in a direction parallel to said tube axis for a vertical distance substantially equal to said first distance so as to produce two spaced apart wall portions having free edges extending parallel to said tube axis and being joined to one another by at least one bridging portion located at least at said one end of the tube to define an initial rack structure;

machining the so-formed initial rack structure along said spaced apart wall portions at spaced intervals along the free edges thereof in a direction perpendicular to said tube axis for a second distance which is less than the height of said wall portions so as to produce a plurality of uniformly spaced support grooves in each of said wall portions for transversely supporting crystal wafers therein; and machining the so-formed initial rack structure surface opposite said spaced apart wall portion thereof along the entire length of such structure in a direction parallel to said tube axis for a third distance which is less than said second distance so as to produce two spaced apart independent wall edges capable of standing on a flat support means.

2. A method as defined in claim 1 wherein said machining step comprises cutting and grinding said tube and said initial rack structure with diamond saws and diamond grinding discs.

3. A method as defined in claim 1 wherein said machining step of said initial rack structure comprises cutting and grinding with diamond saws and diamond grinding discs which have a diameter and thickness substantially corresponding to that of the crystal wafers to be mounted in the ultimately formed rack structures.

* * * * *